United States Patent
Chandrasekharan et al.

(10) Patent No.: US 9,667,251 B1
(45) Date of Patent: May 30, 2017

(54) CHARGE STEERING LATCH FOR LOW SOFT ERROR RATE

(71) Applicant: AVAGO TECHNOLOGIES GENERAL IP (SINGAPORE) PTE. LTD., Singapore (SG)

(72) Inventors: Karthik Chandrasekharan, Chandler, AZ (US); Balaji Narasimham, Aliso Viejo, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/011,224

(22) Filed: Jan. 29, 2016

(51) Int. Cl.
*H03K 19/003* (2006.01)
*H03K 19/20* (2006.01)
*H03K 3/356* (2006.01)

(52) U.S. Cl.
CPC . *H03K 19/00338* (2013.01); *H03K 3/356104* (2013.01); *H03K 19/20* (2013.01)

(58) Field of Classification Search
CPC ....... H03K 19/00338; H03K 3/356104; H03K 19/20; H03K 3/0375; H03K 19/1776; H03K 19/17764; H03K 19/1778; H03K 19/0033; H03K 19/00392; G11C 11/4125; G11C 29/52; G11C 5/005
See application file for complete search history.

(56) References Cited

U.S. PATENT DOCUMENTS

| | | | |
|---|---|---|---|
| 8,723,548 B2 | 5/2014 | Chandrasekharan et al. | |
| 8,864,271 B2 * | 10/2014 | Abe | B41J 11/00 347/16 |
| 2007/0165446 A1 * | 7/2007 | Oliva | B82Y 10/00 365/154 |
| 2014/0015095 A1 | 1/2014 | Hui et al. | |
| 2015/0381155 A1 * | 12/2015 | Park | H03K 3/356104 327/109 |

* cited by examiner

*Primary Examiner* — Jany Richardson
(74) *Attorney, Agent, or Firm* — Oblon, McClelland, Maier & Neustadt, L.L.P.

(57) ABSTRACT

A circuit for steering charges generated from ionization radiation away from a latch includes charge steering transistors operating in strong inversion. The charge steering transistors are electrically coupled to other transistors in stacked inverters within the latch. During normal operation, the charge steering transistors are turned on when the other transistors being coupled to are turned off. The charge steering transistors may reduce the negative impact of ionization radiation on the operation of the latch.

20 Claims, 4 Drawing Sheets

CHARGE STEERING LATCH FOR LOW SOFT ERROR RATE

BACKGROUND

In a modern digital integrated circuit (IC), there are many factors contributing to soft errors in a circuit component, including ionizing radiation (particles and electromagnetic), random thermal and shot noises, and inductive/capacitive crosstalk. For many applications, particles and electromagnetic radiations are the main causes of soft errors due to their intensity and/or proximity to the transistors within the IC.

Particles radiation originates from alpha particle (nucleus having two protons and two neutrons) emission and energetic neutron/proton emission. Alpha particles are frequently detected during the decay process from radioactive packaging materials used in semiconductor packaging. Since packaging materials may be used to encapsulate IC chips for protection and lead connections, alpha particle decay often occur within a few millimeter of the semiconductor in the IC.

Energetic neutrons and protons may be created from high energy electromagnetic radiations impinging on atmospheric particles, thus emitting energetic neutrons and protons. Energetic neutrons that cause soft errors in IC may also come from collisions between neutrons' random motions and thermal agitations of particles surrounding neutrons.

While soft errors typically will not lead to catastrophic break-down of components on an IC chip, they do cause logic errors, and may require the components containing the soft errors to re-compute their stored logic values. For example, a register may store a certain byte value for central-processing units operations. If a soft error occurs within the register, the CPU operations cannot be properly performed unless the correct stored value is somehow retrieved. When dealing with soft errors in IC, an engineer may employ a variety of ways to mitigate, correct, or at least acknowledge soft errors.

SUMMARY OF ILLUSTRATIVE EMBODIMENTS

According to an exemplary embodiment, a charge steering latch includes a first inverter having a first transistor pair and a second transistor pair. The first inverter is configured to invert an input signal, from logic "0" to logic "1" or from logic "1" to logic "0", to an intermediate input signal. The charge steering latch further includes a second inverter having a third transistor pair and a fourth transistor pair. The second inverter is configured to invert the intermediate input signal, from logic "0" to logic "1" or from logic "1" to logic "0", to an output signal. The charge steering latch further includes four charge steering transistors each coupled to a transistor pair for steering unintended current generated from ionization radiation away from the first and second inverters.

DETAILED DESCRIPTION

Figure 1:
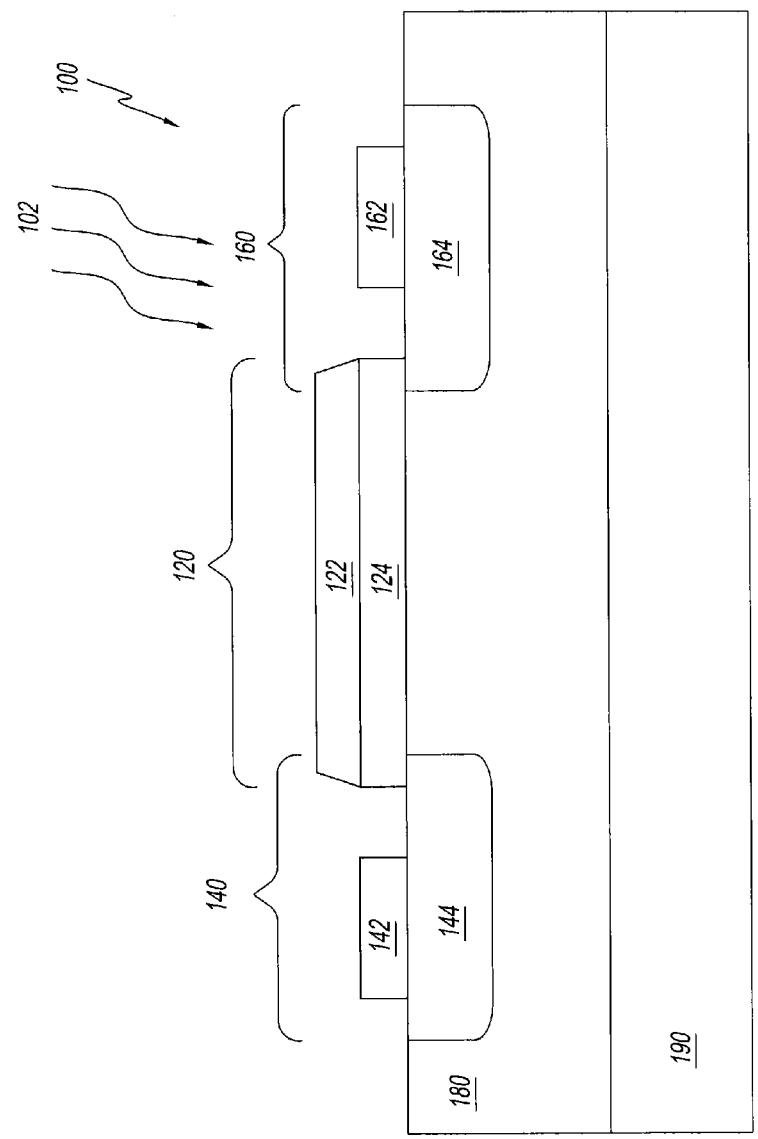
FIG. 1 illustrates an exemplary cross-sectional view of a metal-oxide-semiconductor field-effect transistor.

Referring now to FIG. 1, a metal-oxide-semiconductor field-effect transistor (MOSFET) 100 may include a gate region 120, a source region 140, a drain region 160, and a body 180. The gate region 120 may overlap with the source and drain regions 140, 160. The MOSFET 100 may be p-type (p-MOSFET) or n-type (n-MOSFET). In some embodiments, the transistor may be disposed on top of a substrate 190. The substrate may be a bulk silicon wafer, a silicon-on-insulator substrate, or a glass wafer. Other substrate types may be possible.

Turning now to the gate region 120, which includes a gate 122 and a gate insulator 124, in certain embodiments, the gate 122 may include heavily doped poly-silicon. The poly-silicon may be deposited using chemical vapor deposition. For p-MOSFET, the dopants may include boron. For n-MOSFET, phosphorus and arsenic may be used as dopants. The dopants may be injected into the poly-silicon via ion implantation or diffusion processes. In other embodiments, the gate 122 may include metals, alloys, and metal silicides based on materials such as titanium, titanium nitride, titanium and hafnium nitride, tungsten, ruthenium, and ruthenium oxide. The metallic materials for the gate 122 may be deposited using atomic layer deposition, sputtering, evaporation, sub-atmosphere chemical vapor deposition, metal-oxide chemical vapor deposition, low pressure chemical vapor deposition, plasma enhanced chemical vapor deposition, physical vapor deposition, and self-assembled deposition. Alternative gate materials and deposition methods are possible.

In an exemplary embodiment, the gate insulator 124 may include thermally grown silicon dioxide. Alternatively, the gate insulator 124 may include hafnium dioxide, hafnium silicate, zirconium silicate, zirconium dioxide, and silicon nitride. The materials for the gate insulator 124 may be deposited using atomic layer deposition, sputtering, evaporation, sub-atmosphere chemical vapor deposition, metal-oxide chemical vapor deposition, low pressure chemical vapor deposition, plasma enhanced chemical vapor deposition, physical vapor deposition, and self-assembled deposition. Other gate insulator materials and deposition methods are possible.

The MOSFET 100 may include the source region 140 having a source metal 142 and a heavily doped source well 144. For p-MOSFET, the dopants may include boron. For n-MOSFET, phosphorus and arsenic may be used as dopants. The dopants may be injected into the poly-silicon via ion implantation or diffusion. Materials for the source metal 142 may include metals, alloys, and metal silicides such as tungsten, aluminum, titanium, titanium nitride, titanium silicide, tantalum silicide, tungsten silicide, cobalt silicide, and molybdenum silicide. Other materials can also be used.

Symmetrically, the MOSFET 100 may include the drain region 160 having a drain metal 162 and a heavily doped drain well 164. For p-MOSFET, the dopants may include boron. For n-MOSFET, phosphorus and arsenic may be used as dopants. The dopants may be injected into the poly-silicon via ion implantation or diffusion. Materials for the drain metal 162 may include metals, alloys, and metal silicides such as tungsten, aluminum, titanium, titanium nitride, titanium silicide, tantalum silicide, tungsten silicide, cobalt silicide, and molybdenum silicide. Other materials can also be used.

In selected embodiments, the body 180 of the MOSFET 100 may include semiconductor materials such as crystalline silicon. Other possible materials include poly-crystalline silicon, amorphous silicon, germanium, silicon germanium, and organic semiconductor.

Figure 2:
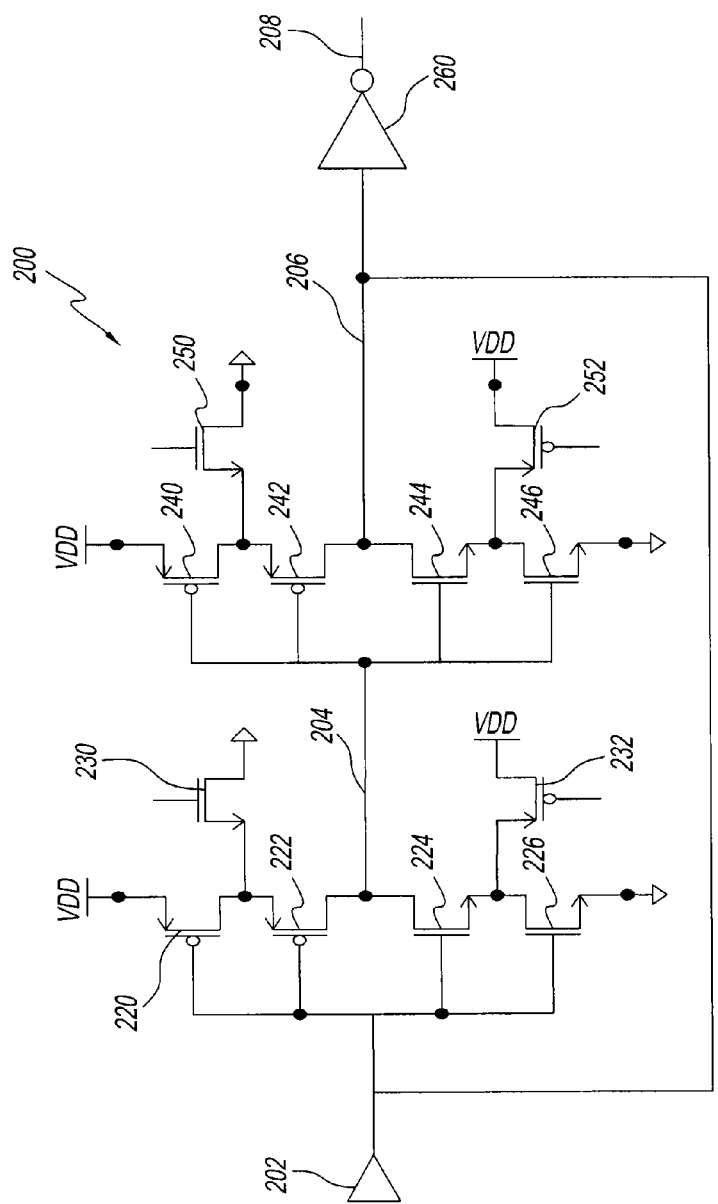
FIG. 2 illustrates an embodiment of a charge-steering latch.

FIG. 2 illustrates an exemplary charge steering latch 200. In certain embodiments, the charge steering latch 200 operates between the floor voltage ("ground") and the ceiling or supply voltage ("$V_{DD}$"). The latch 200 includes an input 202, an intermediate input 204, an intermediate output 206, and an output 208. The input 202 is connected to gate terminals of transistors 220, 222, 224, and 226, and intermediate input 204 is connected to gate terminals of transistors 240, 242, 244, and 246. A charge steering transistor 230 is connected to transistors 220 and 222, and a charge steering transistor 232 is connected to transistors 224 and 226. Similarly, a charge steering transistor 250 is connected to transistors 240 and 242, and a charge steering transistor 252 is connected to transistors 244 and 246. An inverter 260 connects the intermediate output 206 and the output 208.

In certain implementations, the transistors 220, 222, 224, 226 may invert a signal on the input 202. Similarly, the transistors 240, 242, 244, 246 may invert another signal on the intermediate input 204. The transistors 220, 222, 240, 242 may be p-MOSFET, and the transistors 224, 226, 244, 246 may be n-MOSFET. The transistors 220, 222, 224, 226, 240, 242, 244, 246 and the charge steering transistors 230, 232, 250, 252 may be enhancement mode devices. Alternatively, the transistors 220, 222, 224, 226, 240, 242, 244, 246 and the charge steering transistors 230, 232, 250, 252 may be depletion mode devices. A combination of enhancement mode and depletion mode is also possible. The transistors 220, 222, 224, 226 may be connected in series. Similarly, the transistors 240, 242, 244, 246 may be connected in series.

In some embodiments, the charge steering transistors 230, 232, 250, 252 have a larger channel width-to-length ratio than the transistors 220, 222, 224, 226, 240, 242, 244, 246. When activated, the charge steering transistors 230, 232, 250, 252 may operate in a strong inversion regime. The charge steering transistors 230, 250 may be n-MOSFET, and the charge steering transistors 232, 252 may be p-MOSFET.

While the transistors 220, 222, 224, 226, 240, 242, 244, 246 and the charge steering transistors 230, 232, 250, 252 are shown to be MOSFETs in FIG. 2, other device structures are possible, such as high-electron-mobility transistor, silicon-on-insulator transistor, bipolar junction transistor, fin field-effect transistor, multi-gate field effect transistor, junction field effect transistor, metal-semiconductor field effect transistor, insulate-gate bipolar transistor, single electron transistor, thin-film transistor, tunnel field effect transistor, and nanostructure transistor. Further, in certain implementations, at least some of the transistors 220, 222, 224, 226, 240, 242, 244, 246 in FIG. 2 may be substituted with a resistor, a diode, or a transistor operated as a diode.

In some embodiments, the fin field-effect transistor (finFET) structure may be implemented for the transistors 220, 222, 224, 226, 240, 242, 244, 246 and the charge steering transistors 230, 232, 250, 252. An exemplary finFET structure can be found in commonly assigned application U.S. Ser. No. 13/548,123, and its specification is herein incorporated by reference in its entirety. A finFET may include a silicon "fin" on top of a substrate. The channel region of the silicon "fin" may be encapsulated by a layer of insulator, which may be thermally grown silicon dioxide, deposited high-k dielectric, or other suitable insulator. A poly-silicon or metal gate may be disposed over the insulator for controlling the current in the channel region. Exposed regions of the fin may form, after appropriate doping processes, the source and drain regions of the finFET.

During normal operation, an external controller (not shown) may provide a digital signal to the input 202 of the charge steering latch 200 (write operation). The digital signal may be a "high" signal, indicating logic "1", or a "low" signal, indicating logic "0". For an input of logic "1", the high signal is applied to the gate terminals of the transistors 220, 222, 224, 226. Under the application of the high signal, the transistors 220 and 222 may be turned "off". In certain implementations, the transistors 220, 222, 224, 226 may be enhancement mode devices. An enhancement mode MOSFET operating in the "off" state has a relatively low amount of drain current flowing through its body. Examples of the drain current density in the "off" state include 100 pA-$\mu$m$^{-1}$, 1 nA-$\mu$m$^{-1}$, 10 nA-$\mu$m$^{-1}$, 100 nA-$\mu$m$^{-1}$, 1 $\mu$A-$\mu$m$^{-1}$, and 10 $\mu$A-$\mu$m$^{-1}$. Other drain current density values are possible in the "off" state.

An input of logic "1" causes the "high" signal to be applied to the gate terminals of the transistors 224, 226, which may consequently be turned "on". An enhancement mode MOSFET operating in the "on" state has a relatively high amount of drain current flowing through its body. Examples of the drain current density in the "on" state include 1 $\mu$A-$\mu$m$^{-1}$, 10 $\mu$A-$\mu$m$^{-1}$, 100 $\mu$A-$\mu$m$^{-1}$, 1 mA-$\mu$m$^{-1}$, and 10 mA-$\mu$m$^{-1}$. Other drain current density values are possible in the "on" state.

In some embodiments, a logic "1" on the input 202 causes a logic "0", or "low" signal, to appear on the intermediate input 204. The combination of the transistors 220 and 222 being "off" and the transistors 224 and 226 being "on" may create a high resistance conduction path between the intermediate input 204 and $V_{DD}$, and a low resistance conduction path between the intermediate input 204 and ground. A "low" signal may appear on the intermediate input 204 and on the gates of the transistors 240, 242, 244, 246. Under the application of the "low" signal, the transistors 244 and 246 may be turned "off". In certain implementations, the transistors 240, 242, 244, 246 may be enhancement mode devices. An enhancement mode MOSFET operating in the "off" state has a relatively low amount of drain current flowing through its body. Examples of the drain current density in the "off" state include 100 pA-$\mu$m$^{-1}$, 1 nA-$\mu$m$^{-1}$, 10 nA-$\mu$m$^{-1}$, 100 nA-$\mu$m$^{-1}$, 1 $\mu$A-$\mu$m$^{-1}$, and 10 $\mu$A-$\mu$m$^{-1}$. Other drain current density values are possible in the "off" state.

An input of logic "0" on the intermediate input 204 causes the low signal to be applied to the gate terminals of the transistors 240, 242, which may consequently be turned "on". An enhancement mode MOSFET operating in the "on" state has a relatively high amount of drain current flowing through its body. Examples of the drain current density in the "on" state include 1 $\mu$A-$\mu$m$^{-1}$, 10 $\mu$A-$\mu$m$^{-1}$, 100 $\mu$A-$\mu$m$^{-1}$, 1 mA-$\mu$m$^{-1}$, and 10 mA-$\mu$m$^{-1}$. Other drain current density values are possible in the "on" state.

In certain exemplary embodiments, a logic "0" on the intermediate input 204 causes a logic "1", or "high" signal, to appear on the intermediate output 206. The combination of the transistors 244 and 246 being "off" and the transistors 240 and 242 being "on" may create a low resistance conduction path between the intermediate output 206 and $V_{DD}$, and a high resistance conduction path between the intermediate output 206 and ground. A "high" signal may appear on the intermediate output 206. The inverter 260 inverts the "high" signal, and outputs a "low" signal on the output 208.

Alternatively, the charge steering latch 200 may directly output the "high" signal on the intermediate output 206 without inversion.

In some embodiments, the intermediate output 206 is connected to the input 202 in a feedback loop. The "high" signal on the intermediate output 206 may be fed back to reinforce the "high" signal on the input 202. The feedback signal from the intermediate output 206 may assist the charge steering latch 200 in maintaining the "low" signal on the output 208 terminal.

Alternatively, during normal operation, the external controller (not shown) may provide a "low" signal, indicating logic "0", to the input 202. For an input of logic "0", the low signal is applied to the gate terminals of the transistors 220, 222, 224, 226. Under the application of the low signal, the transistors 224 and 226 may be turned "off". Examples of the drain current density in the "off" state include 100 pA-$\mu$m$^{-1}$, 1 nA-m$^{-1}$, 10 nA-$\mu$m$^{-1}$, 100 nA-$\mu$m$^{-1}$, and 10 $\mu$A-$\mu$m$^{-1}$. Other drain current density values are possible in the "off" state.

An input of logic "0" causes the "low" signal to be applied to the gate terminals of the transistors 220, 222, which may consequently be turned "on". An enhancement mode MOSFET operating in the "on" state has a relatively high amount of drain current flowing through its body.

Examples of the drain current density in the "on" state include 1 $\mu$A-$\mu$m$^{-1}$, 10 $\mu$A-$\mu$m$^{-1}$, 100 $\mu$A-$\mu$m$^{-1}$, 1 mA-m$^{-1}$, and 10 mA-m$^{-1}$. Other drain current density values are possible in the "on" state.

In some embodiments, a logic "0" on the input 202 causes a logic "1", or "high" signal, to appear on the intermediate input 204. The combination of the transistors 224 and 226 being "off" and the transistors 220 and 222 being "on" may create a low resistance conduction path between the intermediate input 204 and V$_{DD}$, and a high resistance conduction path between the intermediate input 204 and ground. A "high" signal may appear on the intermediate input 204 and on the gates of the transistors 240, 242, 244, 246. Under the application of the "high" signal, the transistors 240 and 242 may be turned "off". Examples of the drain current density in the "off" state include 100 pA-m$^{-1}$, 1 nA-m$^{-1}$, 10 nA-m$^{-1}$, 100 nA-$\mu$m$^{-1}$, 1 $\mu$A-m$^{-1}$, and 10 pA-$\mu$m$^{-1}$. Other drain current density values are possible in the "off" state.

An input of logic "1" on the intermediate input 204 causes the high signal to be applied to the gate terminals of the transistors 244, 246, which may consequently be turned "on". Examples of the drain current density in the "on" state include 1 $\mu$A–m$^{-1}$, 10 $\mu$A-$\mu$m$^{-1}$, 100 $\mu$A-$\mu$A-$\mu$m$^{-1}$, 1 mA-$\mu$m$^{-1}$, and 10 mA-$\mu$m$^{-1}$. Other drain current density values are possible in the "on" state.

In certain exemplary embodiments, a logic "1" on the intermediate input 204 causes a logic "0", or "low" signal, to appear on the intermediate output 206. The combination of the transistors 244 and 246 being "on" and the transistors 240 and 242 being "off" may create a high resistance conduction path between the intermediate output 206 and V$_{DD}$, and a low resistance conduction path between the intermediate output 206 and ground. A "low" signal may appear on the intermediate output 206. The inverter 260 inverts the "low" signal, and outputs a "high" signal on the output 208. Alternatively, the charge steering latch 200 may directly output the "low" signal on the intermediate output 206 without inversion.

In some embodiments, the intermediate output 206 is connected to the input 202 in a feedback loop. The "low" signal on the intermediate output 206 may be fed back to reinforce the "low" signal on the input 202. The feedback signal from the intermediate output 206 may assist the charge steering latch 200 in maintaining the "high" signal on the output 208 terminal. Returning to FIG. 1, during operation, the MOSFET 100 may be exposed to ionizing radiation 102. The ionizing radiation 102 may include neutrons, alpha particles, protons, electrons, x-rays, and gamma-rays. The ionizing radiation 102 impinging on the MOSFET 100 may generate unintended current within the body 180 of the MOSFET 100. The unintended current may flow toward the source and drain metals 142, 162, and exit the MOSFET 100.

Referring again to FIG. 2, during operation, the transistors 220, 222, 224, 226, 240, 242, 244, 246 may be exposed to the ionizing radiation 102. When a "high" signal (i.e. logic "1") is applied to the gate terminals of the transistors 220, 222, 224, 226, the transistors 224, 226 may be turned "on", creating a low resistance conduction path between the intermediate input 204 and ground. The presence of the ionizing radiation 102 impinging on the transistors 220, 222 may create a first unintended current within bodies of the transistors 220, 222. Even though the "high" signal applied to the gate terminals of the transistors 220, 222 may not cause the transistors 220, 222 to turn "on", the first unintended current generated within the bodies of the transistors 220, 222 may flow toward the intermediate input 204, changing its signal level from "low" to "high".

Turning now to the charge steering transistor 230, in some implementations, the external controller (not shown) applies a "high" signal to the input 202 and the gate terminals of the transistors 220, 222, 224, 226, and a first control signal to a gate of the charge steering transistor 230. The first control signal may be higher in voltage value than the "high" signal applied to the input 202. Under the application of the first control signal, the charge steering transistor 230 may provide a low resistance conduction path between the transistors 220, 222 and ground. In certain exemplary embodiments, the charge steering transistor 230 may have a larger width-to-length ratio than the transistors 224, 226. Additionally, the charge steering transistor 230 may have a lower channel doping concentration than the transistors 224, 226.

When the first control signal is applied to the gate of the charge steering transistor 230, a portion of the first unintended current generated within the bodies of the transistors 220, 222 may be steered away from the intermediate input 204 and toward ground. In some embodiments, applying the first control signal to the gate of the charge steering transistor 230 when applying a "high" signal on the input 202 may inhibit the ionizing radiation 102 from changing the signal value on the intermediate input 204 from "low" to "high".

Next, a "low" signal on the intermediate input 204 may cause the transistors 240, 242 to turn "on", and create a low resistance conduction path between the intermediate output 206 and V$_{DD}$. The presence of the ionizing radiation 102 impinging on the transistors 244, 246 may create a fourth unintended current within bodies of the transistors 244, 246. Even though the "low" signal applied to the gate terminals of the transistors 244, 246 may not cause the transistors 244, 246 to turn "on", the fourth unintended current generated within the bodies of the transistors 244, 246 may flow away from the intermediate output 206, changing its signal level from "high" to "low".

Referring to the charge steering transistor 252, in some implementations, the external controller (not shown) applies a "high" signal to the input 202 and the gate terminals of the transistors 220, 222, 224, 226, and a fourth control signal to a gate of the charge steering transistor 252. The fourth control signal may be lower in voltage value than the "low" signal applied to the intermediate input 204. Under the application of the fourth control signal, the charge steering transistor 252 may provide a low resistance conduction path between the transistors 244, 246 and $V_{DD}$. In certain exemplary embodiments, the charge steering transistor 252 may have a larger width-to-length ratio than the transistors 240, 242. Additionally, the charge steering transistor 252 may have a lower channel doping concentration than the transistors 240, 242.

When the fourth control signal is applied to the gate of the charge steering transistor 252, a portion of the fourth unintended current generated within the bodies of the transistors 244, 246 may be steered away from the intermediate output 206 and toward $V_{DD}$. In some embodiments, applying the fourth control signal to the gate of the charge steering transistor 252 when applying a "high" signal on the input 202 may inhibit the ionizing radiation 102 from changing the signal value on the intermediate output 206 from "high" to "low". Consequently, the charge steering transistor 252 may also inhibit the ionizing radiation 102 from changing the signal value on the input 202, from "high" to "low", via the feedback loop.

In certain implementations, when a "low" signal (i.e. logic "0") is applied to the gate terminals of the transistors 220, 222, 224, 226, the transistors 220, 222 may be turned "on", creating a low resistance conduction path between the intermediate input 204 and $V_{DD}$. The presence of the ionizing radiation 102 impinging on the transistors 224, 226 may create a second unintended current within bodies of the transistors 224, 226. Even though the "low" signal applied to the gate terminals of the transistors 224, 226 may not cause the transistors 224, 226 to turn "on", the second unintended current generated within the bodies of the transistors 224, 226 may flow away from the intermediate input 204, changing its signal level from "high" to "low".

Turning now to the charge steering transistor 232, in some implementations, the external controller (not shown) applies a "low" signal to the input 202 and the gate terminals of the transistors 220, 222, 224, 226, and a second control signal to a gate of the charge steering transistor 232. The second control signal may be lower in voltage value than the "low" signal applied to the input 202. Under the application of the second control signal, the charge steering transistor 232 may provide a low resistance conduction path between the transistors 224, 226 and $V_{DD}$. In certain exemplary embodiments, the charge steering transistor 232 may have a larger width-to-length ratio than the transistors 220, 222. Additionally, the charge steering transistor 232 may have a lower channel doping concentration than the transistors 220, 222.

When the second control signal is applied to the gate of the charge steering transistor 232, a portion of the second unintended current generated within the bodies of the transistors 224, 226 may be steered away from the intermediate input 204 and toward $V_{DD}$. In some embodiments, applying the second control signal to the gate of the charge steering transistor 232 when applying a "low" signal on the input 202 may inhibit the ionizing radiation 102 from changing the signal value on the intermediate input 204 from "high" to "low".

Next, a "high" signal on the intermediate input 204 may cause the transistors 244, 246 to turn "on", and create a low resistance conduction path between the intermediate output 206 and ground. The presence of the ionizing radiation 102 impinging on the transistors 240, 242 may create a third unintended current within bodies of the transistors 240, 242. Even though the "high" signal applied to the gate terminals of the transistors 240, 242 may not cause the transistors 240, 242 to turn "on", the third unintended current generated within the bodies of the transistors 240, 242 may flow toward the intermediate output 206, changing its signal level from "low" to "high".

Referring to the charge steering transistor 250, in some implementations, the external controller (not shown) applies a "low" signal to the input 202 and the gate terminals of the transistors 220, 222, 224, 226, and a third control signal to a gate of the charge steering transistor 250. The third control signal may be higher in voltage value than the "high" signal applied to the intermediate input 204. Under the application of the third control signal, the charge steering transistor 250 may provide a low resistance conduction path between the transistors 240, 242 and ground. In certain exemplary embodiments, the charge steering transistor 250 may have a larger width-to-length ratio than the transistors 244, 246. Additionally, the charge steering transistor 250 may have a lower channel doping concentration than the transistors 244, 246.

When the third control signal is applied to the gate of the charge steering transistor 250, a portion of the third unintended current generated within the bodies of the transistors 240, 242 may be steered away from the intermediate output and toward ground. In some embodiments, applying the third control signal to the gate of the charge steering transistor 250 when applying a "low" signal on the input 202 may inhibit the ionizing radiation 102 from changing the signal value on the intermediate output 206 from "low" to "high". Consequently, the charge steering transistor 250 may also inhibit the ionizing radiation 102 from changing the signal value on the input 202, from "low" to "high", via the feedback loop.

In certain embodiments, the charge steering transistors 230, 252 are turned "off" while the charge steering transistors 232, 250 are turned "on". Alternatively, the charge steering transistors 232, 250 may be "off" while the charge steering transistors 230, 252 may be "on".

Figure 3:
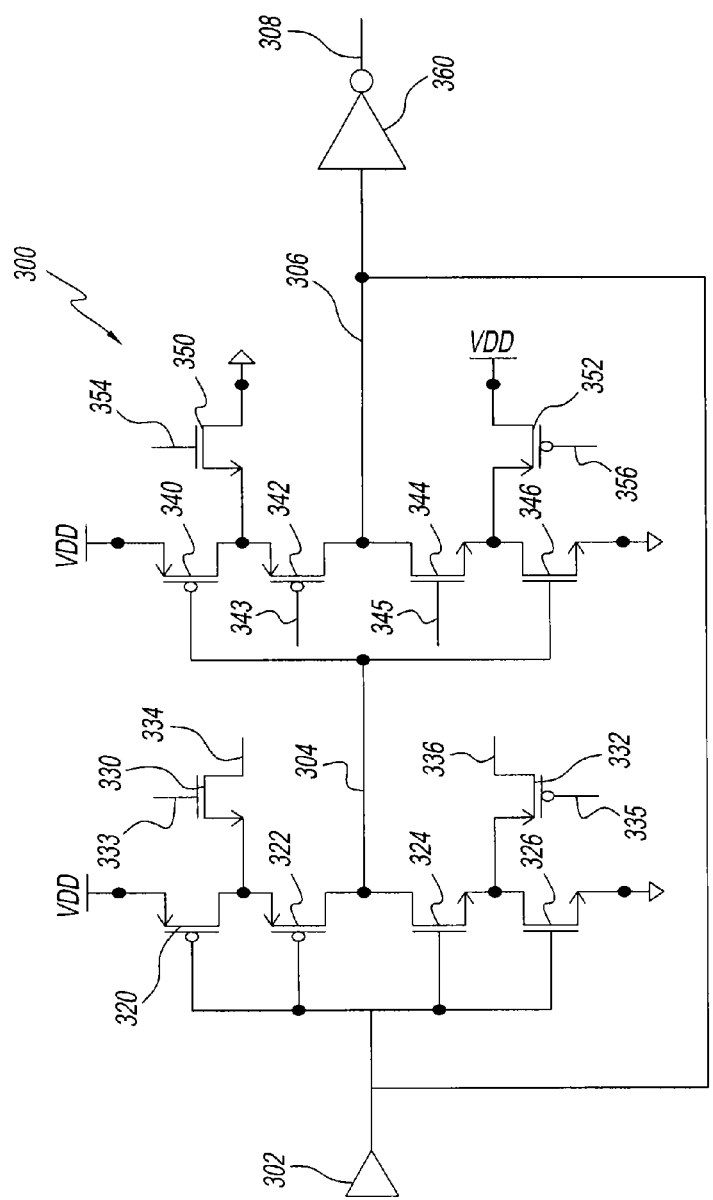
FIG. 3 illustrates another embodiment of a charge-steering latch.

FIG. 3 illustrates another exemplary embodiment of a charge steering latch 300. In certain embodiments, the charge steering latch 300 operates between ground and $V_{DD}$. The latch 300 includes an input 302, an intermediate input 304, an intermediate output 306, and an output 308. The input 302 is connected to gate terminals of transistors 320, 322, 324, and 326, and intermediate input 304 is connected to gate terminals of transistors 340 and 346. A charge steering transistor 330 is connected to transistors 320 and 322, and a charge steering transistor 332 is connected to transistors 324 and 326. Similarly, a charge steering transistor 350 is connected to transistors 340 and 342, and a charge steering transistor 352 is connected to transistors 344 and 346. An inverter 360 connects the intermediate output 306 and the output 308.

In certain implementations, the transistors 320, 322, 324, 326 may invert a signal on the input 302. Similarly, the transistors 340, 346 may invert another signal on the intermediate input 204. The transistors 320, 322, 340, 342 may be p-MOSFET, and the transistors 324, 326, 344, 346 may be n-MOSFET. The transistors 320, 322, 324, 326, 340, 342, 344, 346 and the charge steering transistors 330, 332, 350, 352 may be enhancement mode devices. Alternatively, the transistors 320, 322, 324, 326, 340, 342, 344, 346 and the charge steering transistors 330, 332, 350, 352 may be depletion mode devices. A combination of enhancement mode and depletion mode is also possible. The transistors 320, 322, 324, 326 may be connected in series. Similarly, the transistors 340, 342, 344, 346 may be connected in series.

In some embodiments, the charge steering transistors 330, 332, 350, 352 have a larger channel width-to-length ratio than the transistors 320, 322, 324, 326, 340, 342, 344, 346. When activated, the charge steering transistors 330, 332, 350, 352 may operate in a strong inversion regime. The charge steering transistors 330, 350 may be n-MOSFET, and the charge steering transistors 332, 352 may be p-MOSFET.

While the transistors 320, 322, 324, 326, 340, 342, 344, 346 and the charge steering transistors 330, 332, 350, 352 are shown to be MOSFETs in FIG. 2, other device structures are possible, such as high-electron-mobility transistor, silicon-on-insulator transistor, bipolar junction transistor, fin field-effect transistor, multi-gate field effect transistor, junction field effect transistor, metal-semiconductor field effect transistor, insulate-gate bipolar transistor, single electron transistor, thin-film transistor, tunnel field effect transistor, and nanostructure transistor. Further, in certain implementations, at least some of the transistors 320, 322, 324, 326, 340, 342, 344, 346 in FIG. 2 may be substituted with a resistor, a diode, or a transistor operated as a diode.

In some embodiments, the fin field-effect transistor (finFET) structure may be implemented for the transistors 320, 322, 324, 326, 340, 342, 344, 346 and the charge steering transistors 330, 332, 350, 352.

During normal operation, an external controller (not shown) may provide a digital signal to the input 302 of the charge steering latch 300 (write operation). The digital signal may be a "high" signal, or a "low" signal. For an input of logic "1", the high signal is applied to the gate terminals of the transistors 320, 322, 324, 326. Under the application of the high signal, the transistors 320 and 322 may be turned "off". In certain implementations, the transistors 320, 322, 324, 326 may be enhancement mode devices. An enhancement mode MOSFET operating in the "off" state has a relatively low amount of drain current flowing through its body. Examples of the drain current density in the "off" state include 100 pA-$\mu$m$^{-1}$, 1 nA-$\mu$m$^{-1}$, 10 nA-$\mu$m$^{-1}$, 100 nA-$\mu$m$^{-1}$, 1 $\mu$A-$\mu$m$^{-1}$, and 10 $\mu$A-$\mu$m$^{-1}$. Other drain current density values are possible in the "off" state.

In some embodiments, the input 302 may be synchronized to a clock signal CLK or an inverted clock signal $\overline{CLK}$. The clock signal and the inverted clock signal may be square waves periodically oscillating between ground and V$_{DD}$. The clock and inverted clock signals may be 180° ($\pi$ rad) out of phase. For example, at a particular time, the clock signal may be "high" and the inverted clock signal may be "low". Alternatively, at another time, the clock signal may be "low" and the inverted clock signal may be "high". The clock signal may be generated by a clock generator such as a quartz piezo-electric oscillator, a phase locked loop circuit, a passive LRC circuit, or other means for generating a periodic signal. The clock and inverted clock signals may be higher in voltage values than the "high" signal applied to the input 302.

An input of logic "1" causes the "high" signal to be applied to the gate terminals of the transistors 324, 326, which may consequently be turned "on". An enhancement mode MOSFET operating in the "on" state has a relatively high amount of drain current flowing through its body. Examples of the drain current density in the "on" state include 1 $\mu$A-$\mu$m$^{-1}$, 10 $\mu$A-$\mu$m$^{-1}$, 100 $\mu$A-$\mu$m$^{-1}$, 1 mA-$\mu$m$^{-1}$, and 10 mA-$\mu$m$^{-1}$. Other drain current density values are possible in the "on" state.

In some embodiments, a logic "1" on the input 302 causes a "low" signal to appear on the intermediate input 304. The combination of the transistors 320 and 322 being "off" and the transistors 324 and 326 being "on" may create a high resistance conduction path between the intermediate input 304 and V$_{DD}$, and a low resistance conduction path between the intermediate input 304 and ground. A "low" signal may appear on the intermediate input 304 and on the gates of the transistors 340, 346. Under the application of the "low" signal, the transistor 346 may be turned "off". In certain implementations, the transistors 340, 342, 344, 346 may be enhancement mode devices. An enhancement mode MOSFET operating in the "off" state has a relatively low amount of drain current flowing through its body. Examples of the drain current density in the "off" state include 100 pA-$\mu$m$^{-1}$, 1 nA-$\mu$m$^{-1}$, 10 nA-$\mu$m$^{-1}$, 100 nA-$\mu$m$^{-1}$, 1 pA-$\mu$m$^{-1}$, and 10 $\mu$A-$\mu$m$^{-1}$. Other drain current density values are possible in the "off" state.

An input of logic "0" on the intermediate input 304 causes the low signal to be applied to the gate terminal of the transistor 340, which may consequently be turned "on". An enhancement mode MOSFET operating in the "on" state has a relatively high amount of drain current flowing through its body. Examples of the drain current density in the "on" state include 1 $\mu$A-$\mu$m$^{-1}$, 10 $\mu$A-$\mu$m$^{-1}$, 100 $\mu$A-$\mu$m$^{t1}$, 1 mA-$\mu$m$^{-1}$, and 10 mA-$\mu$m$^{-1}$. Other drain current density values are possible in the "on" state.

In some implementations, a gate terminal 343 of the transistor 342 may be connected to the clock signal, and a gate terminal 345 of the transistor 344 may be connected to the inverted clock signal. When the clock signal is "high" and the inverted clock signal is "low", the transistors 342, 344 are turned "off", creating two high resistance conductions paths between the transistors 340, 346 and the intermediate output 306. The high resistance conduction paths between the transistors 340, 346 and the intermediate output 306 may reduce contention during the write operation.

In certain exemplary embodiments, a logic "0" on the intermediate input 304 causes a logic "1", or "high" signal, to appear on the intermediate output 306 when the clock signal is "low" and the inverted clock signal is "high". The combination of the transistor 346 being "off" and the transistor 340 being "on" may create a low resistance conduction path between the intermediate output 306 and V$_{DD}$, and a high resistance conduction path between the intermediate output 306 and ground. A "high" signal may appear on the intermediate output 306. The inverter 360 inverts the "high" signal, and outputs a "low" signal on the output 308. Alternatively, the charge steering latch 300 may directly output the "high" signal on the intermediate output 306 without inversion.

In some embodiments, the intermediate output 306 is connected to the input 302 in a feedback loop. The "high" signal on the intermediate output 306 may be fed back to reinforce the "high" signal on the input 302. The feedback signal from the intermediate output 306 may assist the charge steering latch 300 in maintaining the "low" signal on the output 308 terminal.

Alternatively, during normal operation, the external controller (not shown) may provide a "low" signal, indicating logic "0", to the input 302. For an input of logic "0", the low signal is applied to the gate terminals of the transistors 320, 322, 324, 326. Under the application of the low signal, the transistors 324 and 326 may be turned "off". Examples of the drain current density in the "off" state include 100 pA-$\mu$m$^{-1}$, 1 nA-$\mu$m$^{-1}$, 10 nA-$\mu$m$^{-1}$, 100 nA-$\mu$m$^{-1}$, and 10 $\mu$A-$\mu$m$^{-1}$. Other drain current density values are possible in the "off" state.

An input of logic "0" causes the "low" signal to be applied to the gate terminals of the transistors 320, 322, which may consequently be turned "on". An enhancement mode MOS- FET operating in the "on" state has a relatively high amount of drain current flowing through its body. Examples of the drain current density in the "on" state include 1 µA-µm$^{-1}$, 10 µA-µm$^{-1}$, 100 µA-µm$^{-1}$, 1 mA-µm$^{-1}$, and 10 mA-µm$^{-1}$. Other drain current density values are possible in the "on" state.

In some embodiments, a logic "0" on the input 302 causes a logic "1", or "high" signal, to appear on the intermediate input 304. The combination of the transistors 324 and 326 being "off" and the transistors 320 and 322 being "on" may create a low resistance conduction path between the intermediate input 304 and V$_{DD}$, and a high resistance conduction path between the intermediate input 304 and ground. A "high" signal may appear on the intermediate input 304 and on the gates of the transistors 340, 346. Under the application of the "high" signal, the transistor 340 may be turned "off". Examples of the drain current density in the "off" state include 100 pA-µm$^{-1}$, 1 nA-µm$^{-1}$, 10 nA-µm$^{-1}$, 100 nA-µm$^{-1}$, 1 µA-µm$^{-1}$, and 10 µA-µm$^{-1}$. Other drain current density values are possible in the "off" state.

An input of logic "1" on the intermediate input 304 causes the high signal to be applied to the gate terminal of the transistor 346, which may consequently be turned "on". Examples of the drain current density in the "on" state include 1 µA-µm$^{-1}$, 10 pA-µm$^{-1}$, 100 µA-µm$^{-1}$, 1 and 10 mA-µm$^{-1}$. Other drain current density values are possible in the "on" state.

In certain exemplary embodiments, a logic "1" on the intermediate input 304 causes a logic "0", or "low" signal, to appear on the intermediate output 306 when the clock signal is "low" and the inverted clock signal is "high". The combination of the transistor 346 being "on" and the transistors 340 being "off" may create a high resistance conduction path between the intermediate output 306 and V$_{DD}$, and a low resistance conduction path between the intermediate output 306 and ground. A "low" signal may appear on the intermediate output 306. The inverter 360 inverts the "low" signal, and outputs a "high" signal on the output 308. Alternatively, the charge steering latch 300 may directly output the "low" signal on the intermediate output 306 without inversion.

In some embodiments, the intermediate output 306 is connected to the input 302 in a feedback loop. The "low" signal on the intermediate output 306 may be fed back to reinforce the "low" signal on the input 302. The feedback signal from the intermediate output 306 may assist the charge steering latch 300 in maintaining the "high" signal on the output 308 terminal.

Still referring to FIG. 3, during operation, the transistors 320, 322, 324, 326, 340, 342, 344, 346 may be exposed to the ionizing radiation 102. When a "high" signal (i.e. logic "1") is applied to the gate terminals of the transistors 320, 322, 324, 326, the transistors 324, 326 may be turned "on", creating a low resistance conduction path between the intermediate input 304 and ground. The presence of the ionizing radiation 102 impinging on the transistors 320, 322 may create a fifth unintended current within bodies of the transistors 320, 322. Even though the "high" signal applied to the gate terminals of the transistors 320, 322 may not cause the transistors 320, 322 to turn "on", the fifth unintended current generated within the bodies of the transistors 320, 322 may flow toward the intermediate input 304, changing its signal level from "low" to "high".

Turning now to the charge steering transistor 330, in some implementations, the inverted clock signal is applied to a gate 333 of the charge steering transistor 330. A source 334 of the charge steering transistor 330 is connected to the output 308. The external controller (not shown) applies a "high" signal to the input 302 and the gate terminals of the transistors 320, 322, 324, 326. When the inverted clock signal is "high", the charge steering transistor 330 may provide a low resistance conduction path between the transistors 320, 322 and the output 308. In certain exemplary embodiments, the charge steering transistor 330 may have a larger width-to-length ratio than the transistors 324, 326. Additionally, the charge steering transistor 330 may have a lower channel doping concentration than the transistors 324, 326.

When the inverted clock signal is "high", a portion of the fifth unintended current generated within the bodies of the transistors 320, 322 may be steered away from the intermediate input 304 and toward the output 308. In some embodiments, applying a "high" inverted clock signal to the gate 333 of the charge steering transistor 330 while applying a "high" signal on the input 302 may inhibit the ionizing radiation 102 from changing the signal value on the intermediate input 304 from "low" to "high".

Next, a "low" signal on the intermediate input 304 and a "low" clock signal may cause the transistor 340 to turn "on", and create a low resistance conduction path between the intermediate output 306 and V$_{DD}$. The presence of the ionizing radiation 102 impinging on the transistor 346 may create an eight unintended current within body of the transistor 346. Even though the "low" signal applied to the gate terminal of the transistors 246 may not cause the transistor 346 to turn "on", the eighth unintended current generated within the body of the transistor 346 may flow away from the intermediate output 306, changing its signal level from "high" to "low".

Referring to the charge steering transistor 352, in some implementations, the "low" signal on the output 308 is applied to a gate 356 of the charge steering transistor 352. The external controller (not shown) applies a "high" signal to the input 302 and the gate terminals of the transistors 320, 322, 324, 326. When the signal on the output 308 is "low" and the inverted clock signal is "high", the charge steering transistor 352 may provide a low resistance conduction path between the transistor 346 and V$_{DD}$. In certain exemplary embodiments, the charge steering transistor 352 may have a larger width-to-length ratio than the transistors 340, 342. Additionally, the charge steering transistor 352 may have a lower channel doping concentration than the transistors 340, 342.

When the inverted clock signal is "high", a portion of the eighth unintended current generated within the body of the transistor 346 may be steered away from the intermediate output 306 and toward V$_{DD}$. In some embodiments, applying a "low" signal to the gate 356 of the charge steering transistor 352 while applying a "high" signal on the input 302 may inhibit the ionizing radiation 102 from changing the signal value on the intermediate output 306 from "high" to "low". Consequently, the charge steering transistor 352 may also inhibit the ionizing radiation 102 from changing the signal value on the input 302, from "high" to "low", via the feedback loop.

In certain implementations, when a "low" signal (i.e. logic "0") is applied to the gate terminals of the transistors 320, 322, 324, 326, the transistors 320, 322 may be turned "on", creating a low resistance conduction path between the intermediate input 304 and V$_{DD}$. The presence of the ionizing radiation 102 impinging on the transistors 324, 326 may create a sixth unintended current within bodies of the transistors 324, 326. Even though the "low" signal applied to the gate terminals of the transistors 324, 326 may not cause the transistors 324, 326 to turn "on", the sixth unintended current generated within the bodies of the transistors 324, 326 may flow away from the intermediate input 304, changing its signal level from "high" to "low".

Turning now to the charge steering transistor 332, in some implementations, the clock signal is applied to a gate 335 of the charge steering transistor 332. A source 336 of the charge steering transistor 332 is connected to the output 308. The external controller (not shown) applies a "low" signal to the input 302 and the gate terminals of the transistors 320, 322, 324, 326. When the clock signal is "low", the charge steering transistor 332 may provide a low resistance conduction path between transistors the 324, 326 and the output 308. In certain exemplary embodiments, the charge steering transistor 332 may have a larger width-to-length ratio than the transistors 320, 322. Additionally, the charge steering transistor 332 may have a lower channel doping concentration than the transistors 320, 322.

When the clock signal is "low", a portion of the sixth unintended current generated within the bodies of the transistors 324, 326 may be steered away from the intermediate input 304 and toward the output 308. In some embodiments, applying a "low" clock signal to the gate 335 of the charge steering transistor 332 while applying a "low" signal on the input 302 may inhibit the ionizing radiation 102 from changing the signal value on the intermediate input 304 from "high" to "low".

Next, a "high" signal on the intermediate input 304 and a "high" inverted clock signal may cause the transistor 346 to turn "on", and create a low resistance conduction path between the intermediate output 306 and ground. The presence of the ionizing radiation 102 impinging on the transistor 340 may create an seventh unintended current within body of the transistor 340. Even though the "high" signal applied to the gate terminal of the transistors 240 may not cause the transistor 340 to turn "on", the seventh unintended current generated within the body of the transistor 340 may flow toward the intermediate output 306, changing its signal level from "low" to "high".

Referring to the charge steering transistor 350, in some implementations, the "high" signal on the output 308 is applied to a gate 354 of the charge steering transistor 350. The external controller (not shown) applies a "low" signal to the input 302 and the gate terminals of the transistors 320, 322, 324, 326. When the signal on the output 308 is "high" and the clock signal is "low", the charge steering transistor 350 may provide a low resistance conduction path between the transistor 340 and ground. In certain exemplary embodiments, the charge steering transistor 350 may have a larger width-to-length ratio than the transistors 344, 346. Additionally, the charge steering transistor 350 may have a lower channel doping concentration than the transistors 344, 346.

When the clock signal is "low", a portion of the seventh unintended current generated within the body of the transistor 340 may be steered away from the intermediate output 306 and toward ground. In some embodiments, applying a "high" signal to the gate 354 of the charge steering transistor 350 while applying a "low" signal on the input 302 may inhibit the ionizing radiation 102 from changing the signal value on the intermediate output 306 from "low" to "high". Consequently, the charge steering transistor 350 may also inhibit the ionizing radiation 102 from changing the signal value on the input 302, from "low" to "high", via the feedback loop.

In certain embodiments, the charge steering transistors 330, 352 are turned "off" while the charge steering transistors 332, 350 are turned "on". Alternatively, the charge steering transistors 332, 350 may be "off" while the charge steering transistors 330, 352 may be "on".

In some embodiments, the charge steering latch 300 may be implemented as a charge steering pulsed latch. A pulse train may be synchronized with the clock and inverted clock signal for driving the charge steering pulsed latch. The charge steering pulsed latch may consume less power than the charge steering latch. A detailed description of a conventional pulsed latch can be found in commonly assigned U.S. Pat. No. 8,723,548, and its specification is herein incorporated by reference in its entirety.

Figure 4:
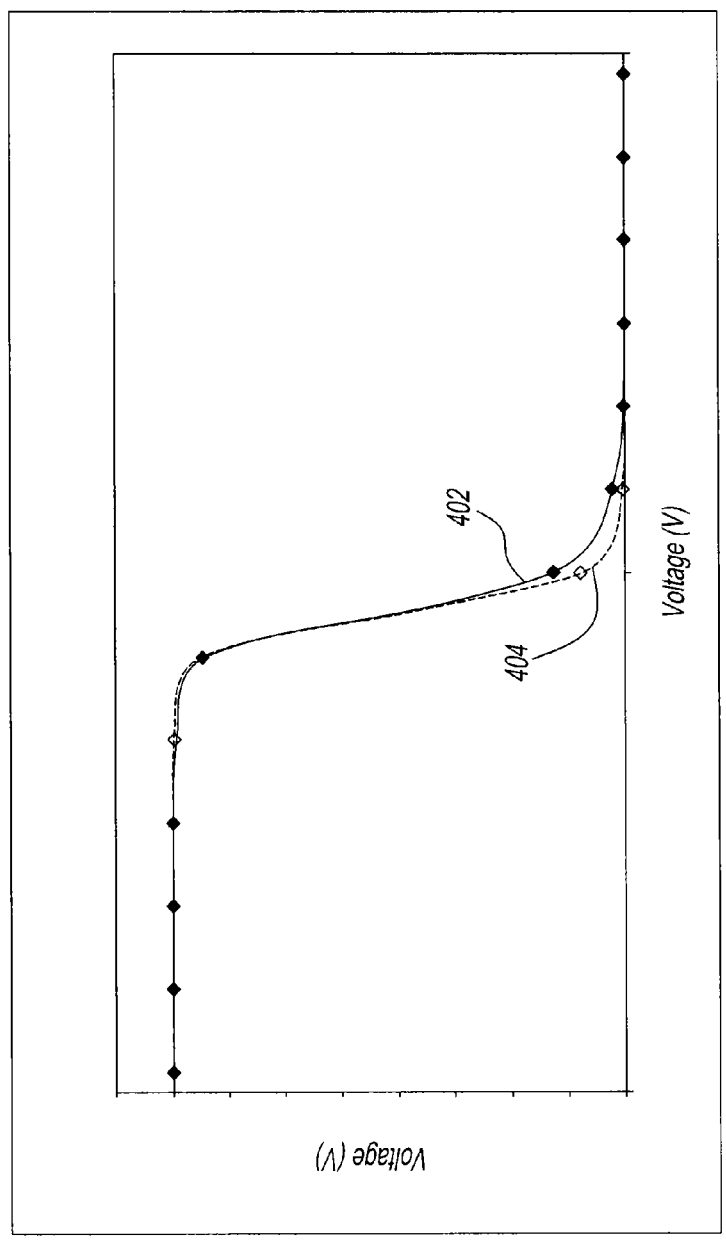
FIG. 4 illustrates a voltage transfer curve of the charge-steering latch.

Referring now to FIG. 4, which illustrates an exemplary voltage transfer curve of the charge steering latch 300, a first curve 402 indicates the voltage at the output 308 when the voltage at the input 302 changes from "high" to "low". A second curve 404 illustrates the voltage at the output 308 when the voltage at the input changes from "low" to "high". In some embodiments, the charge steering latch shows minimum hysteresis behavior.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, some implementations may be performed on modules or hardware not identical to those described. Accordingly, other implementations are within the scope that may be claimed.

The invention claimed is:
1. A circuit comprising:
an input;
a first inverter including a first transistor pair and a second transistor pair, the first inverter being configured to invert a first signal on the input to a second signal on an intermediate input;
a second inverter including a third transistor pair and a fourth transistor pair, the second inverter being configured to invert the second signal on the intermediate input to a third signal on an output;
a first charge steering transistor configured to steer a first current away from the first transistor pair, the first current being generated within the first transistor pair from an ionization radiation;
a second charge steering transistor configured to steer a second current away from the second transistor pair, the second current being generated within the transistor pair from the ionization radiation;
a third charge steering transistor configured to steer a third current away from the transistor pair, the third current being generated within the third transistor pair from the ionization radiation; and
a fourth charge steering transistor configured to steer a fourth current away from the fourth transistor pair, the fourth current being generated within the fourth transistor pair from the ionization radiation.
2. The circuit of claim 1, further comprising a feedback loop.

3. The circuit of claim 1, further comprising a third inverter configured to invert the third signal on the output to a fourth signal.

4. The circuit of claim 1, wherein the first and third transistor pairs and the second and fourth charge steering transistors are p-MOSFET.

5. The circuit of claim 1, wherein the second and fourth transistor pairs and the first and third charge steering transistors are n-MOSFET.

6. The circuit of claim 1, wherein at least one of the charge steering transistors has a larger width-to-length ratio than the transistor pairs.

7. The circuit of claim 1, wherein the first and fourth charge steering transistors are configured to be turned on while the second and third charge steering transistors are configured to be turned off.

8. A method, comprising the steps of:
at a first inverter including a first transistor:
    receiving an input signal, wherein the input signal indicates logic low or logic high;
    inverting the received input signal to an inverted signal having an opposite logic value as the input signal;
    outputting the inverted signal to a second inverter;
at the second inverter including a second transistor:
    receiving the inverted signal from the first inverter;
    inverting the inverted signal to an output signal having a same logic value as the input signal; and
at a charge steering transistor coupled to one of the first or second transistor:
    providing a low resistance conduction path for steering an unintended current away from the first inverter, the unintended current being generated within the one of the first or second transistor from an ionizing radiation, wherein the one of the first or second transistor being operated in an off state.

9. The method of claim 8, further comprising the steps of:
providing the output signal to the first inverter through a feedback loop; and
adding the output signal to the input signal.

10. The method of claim 8, further comprising driving the first inverter, the second inverter, and the charge steering transistor with a pulse.

11. The method of claim 8, further comprising operating the charge steering transistor in a strong inversion regime.

12. The method of claim 8, wherein the first inverter or the second inverter further includes a device selected from the group consisting of a p-MOSFET, an n-MOSFET, a resistor, and a diode.

13. The method of claim 8, further comprising steering the unintended current toward a ground.

14. A latch, comprising:
an input terminal;
a first inverting circuit including a first set of two p-MOSFET and two n-MOSFET connected in series, wherein gates of the first set of two p-MOSFET and two n-MOSFET being electrically coupled to the input terminal, the first inverting circuit being biased between a ceiling voltage and a floor voltage and configured to output an intermediate signal on an intermediate terminal;
a second inverting circuit including a second set of two p-MOSFET and two n-MOSFET connected in series, wherein gates of the second set of two p-MOSFET and two n-MOSFET being electrically coupled to the intermediate terminal, the second inverting circuit being biased between a ceiling voltage and a floor voltage and configured to output an output signal on an output terminal; and
charge steering means for steering an unintended current away from the first inverting circuit or the second inverting circuit, the charge steering means includes at least one transistor coupled to the first or second inverting circuit.

15. The latch of claim 14, further comprising a feedback loop connecting the input terminal and the output terminal for summing the output signal and the input signal.

16. The latch of claim 14, wherein the latch is driven by a pulse train.

17. The latch of claim 14, wherein the at least one transistor being further coupled to a ground terminal.

18. The latch of claim 14, wherein the at least one transistor being further coupled to a supply voltage terminal.

19. The latch of claim 14, wherein the at least one transistor being operated in a strong inversion regime.

20. The latch of claim 14, wherein the charge steering means further includes a second transistor coupled to the first or second inverting circuit, the second transistor being operably turned on while the at least one transistor being operably turned off.

* * * * *